(12) United States Patent
Wiktor et al.

(10) Patent No.: US 7,627,053 B2
(45) Date of Patent: Dec. 1, 2009

(54) APPARATUS AND METHOD FOR DRIVING A PULSE WIDTH MODULATION REFERENCE SIGNAL

(75) Inventors: Stefan W. Wiktor, Raleigh, NC (US); Vladimir A. Muratov, Manchester, NH (US); Xuening Li, Cary, NC (US)

(73) Assignee: Texas Instruments Incorporated, Dallas, TX (US)

( * ) Notice: Subject to any disclaimer, the term of this patent is extended or adjusted under 35 U.S.C. 154(b) by 629 days.

(21) Appl. No.: 11/170,203

(22) Filed: Jun. 29, 2005

(65) Prior Publication Data

US 2007/0002944 A1 Jan. 4, 2007

(51) Int. Cl.
*H04L 27/10* (2006.01)
(52) U.S. Cl. ......................... 375/283; 327/31
(58) Field of Classification Search ................. 375/238; 327/31
See application file for complete search history.

(56) References Cited

U.S. PATENT DOCUMENTS

| | | | | |
|---|---|---|---|---|
| 4,389,638 A * | 6/1983 | Gontowski, Jr. | .......... | 340/384.4 |
| 5,841,643 A * | 11/1998 | Schenkel | ................. | 363/21.13 |
| 6,668,334 B1 * | 12/2003 | Abel et al. | .................. | 713/500 |
| 6,798,372 B1 * | 9/2004 | Yang et al. | .................. | 341/157 |
| 6,819,577 B1 | 11/2004 | Wiktor et al. | | |
| 2004/0051391 A1* | 3/2004 | O'Shaughnessy | ........... | 307/109 |
| 2005/0058235 A1* | 3/2005 | Beeson et al. | ................ | 375/376 |

OTHER PUBLICATIONS

"High-Frequency, Multiphase Controller," Texas Instruments, TPS40090, TPS40091, SLUS578B—Oct. 2003—revised May 2006, pp. 1-30.
"Two-Phase, Synchronous Buck Controller With Integrated MOSFET Drivers," TPS40130, SLUS602B—Jun. 2004—revised Sep. 2005, pp. 1-38.

* cited by examiner

*Primary Examiner*—Shuwang Liu
*Assistant Examiner*—Michael R Neff
(74) *Attorney, Agent, or Firm*—John J. Patti; Wade J. Brady, III; Frederick J. Telecky, Jr.

(57) ABSTRACT

An apparatus for driving a pulse width modulation reference signal includes: (a) A converting unit receiving an input signal at an input locus and presenting an output current at an output locus. The input signal varies at a first frequency. The output current is substantially related with the first frequency. (b) A capacitive element coupled with the output locus for charging by the output current. The pulse width modulation reference signal is related with voltage across the capacitive element.

5 Claims, 3 Drawing Sheets

APPARATUS AND METHOD FOR DRIVING A PULSE WIDTH MODULATION REFERENCE SIGNAL

TECHNICAL FIELD

The present invention is directed to a signal generating apparatus, and especially to a current generating apparatus that is particularly useful in connection with operating a pulse width modulation device.

BACKGROUND

Many devices depend upon accuracy of a pulse width modulation (PWM) device for proper, reliable operation. By way of example and not by way of limitation, a voltage mode DC-to-DC controller device requires a constant ratio of input voltage to a PWM ramp signal. The PWM ramp signal slope is typically generated by a voltage across a capacitive device to which a constant ramp charge current is applied. There are various sources of inaccuracy within circuitry employed to carry out such functions, including, by way of example and not by way of limitation, process variations, voltage coefficient differences and temperature coefficient differences among various components employed in constructing the circuitry. Component fabrication techniques and processes are difficult to control to yield individual components having precise values.

There is a need for an apparatus and method for driving a pulse width modulation reference signal that maintains precision of operation when the apparatus is subjected to environmental change.

SUMMARY

An apparatus for driving a pulse width modulation reference signal includes: (a) A converting unit receiving an input signal at an input and presenting an output current at an output locus. The input signal varies at a first frequency. The output current is substantially related with the first frequency. (b) A capacitive element coupled with the output for charging by the output current. The pulse width modulation reference signal is related with voltage across the capacitive element.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
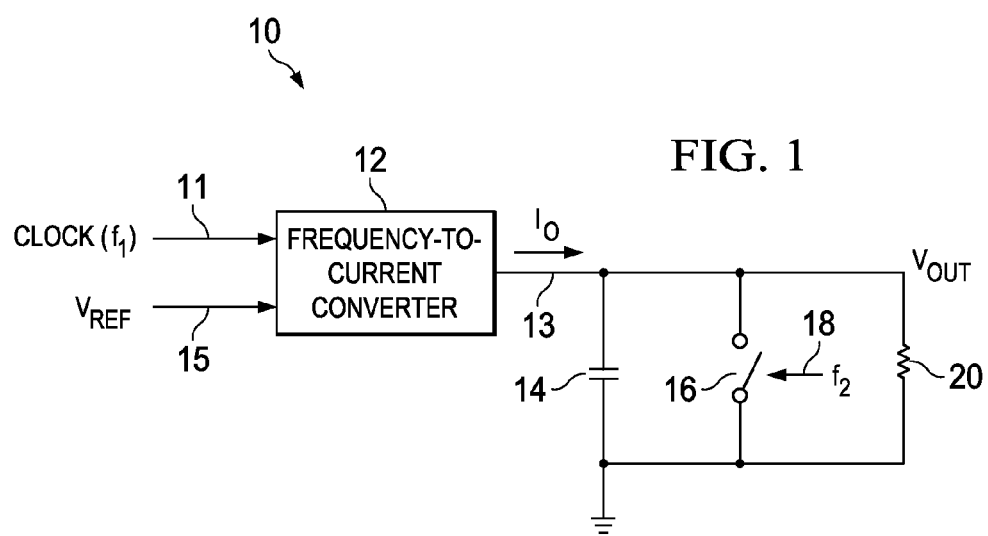
FIG. 1 is a schematic diagram of the apparatus in accordance with a preferred embodiment of the present invention.

Refer now to the drawings wherein depicted elements are, for the sake of clarity, not necessarily shown to scale and wherein like or similar elements are designated by the same reference numeral through the several views.

As mentioned above, component fabrication techniques and processes are difficult to control to yield individual components having precise values. However, it is known that ratios of values among components may be more precisely controlled than particular values for individual components. In part this precision of control occurs because many components are relatively small in size and located relatively close together in a circuit so that a influence (e.g., temperature change or the like) on one component influences close-by similarly sized components similarly. A beneficial result is that ratios among such closely located components tend to track together.

FIG. 1 is a schematic diagram in accordance with a preferred embodiment of the present invention. In FIG. 1, a pulse width modulation (PWM) ramp signal generating device 10 includes a frequency-to-current converter 12, a ramp capacitor 14 and a switch 16. Switch 16 is coupled across ramp capacitor 14 in an orientation appropriate to short ramp capacitor 14 when switch 16 is closed. Switch 16 is driven by an actuator (not shown in detail in FIG. 1; represented by an arrow 18) operating at a frequency $f_2$. A load 20 may be coupled in parallel with ramp capacitor 14 and switch 16.

Frequency-to-current converter 12 receives a first input reference signal CLK (having a frequency $f_1$) at an input terminal 11 and receives a second input reference signal $V_{REF}$ at an input terminal 15. Frequency-to-current converter 12 presents an output current signal $I_O$ at an output terminal 13. Output current $I_O$ preferably varies substantially directly with input frequency $f_1$ so that, $$I_O \sim k \cdot f_1 \cdot V_{REF} \tag{1}$$

Where k is a constant.

An output ramp signal $V_{RAMP}$ is presented across load 20 that varies substantially directly with input signal $V_{REF}$ multiplied by a ratio of frequencies $f_1$, $f_2$ so that, $$V_{RAMP} \sim k \cdot \frac{f_1}{f_2} \cdot V_{REF} \tag{2}$$

Figure 2:
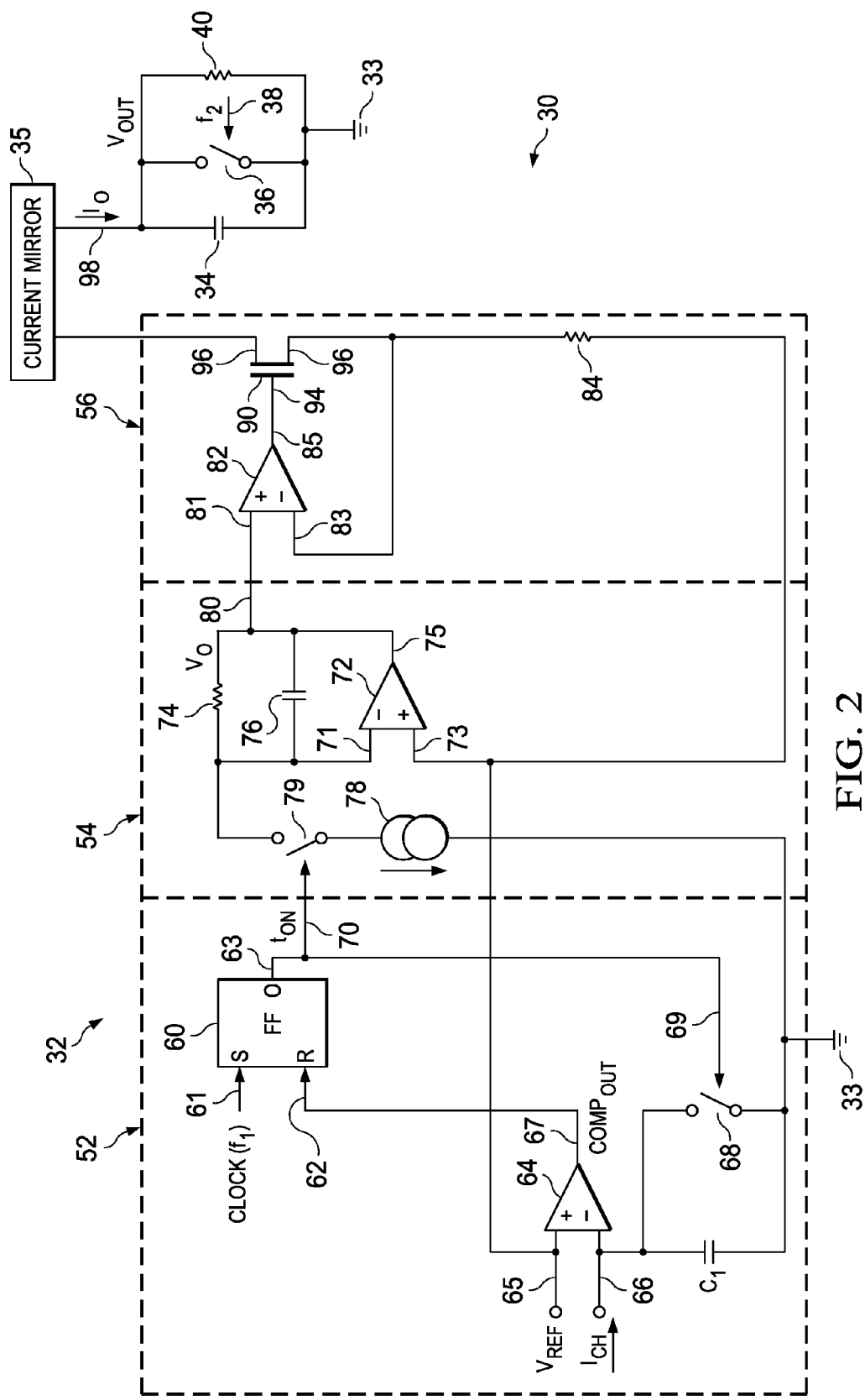
FIG. 2 is a schematic diagram of a preferred embodiment of the present invention.

FIG. 2 is a schematic diagram in accordance with a preferred embodiment of the present invention. In FIG. 2, a pulse width modulation (PWM) ramp signal generating device 30 includes a frequency-to-current converter 32, a ramp capacitor 34 and a switch 36. Switch 36 is coupled across ramp capacitor 34 in an orientation appropriate to short ramp capacitor 34 when switch 36 is closed. Switch 36 is driven by an actuator (represented by an arrow 38) operating at a frequency $f_2$. A load 40 may be coupled in parallel with ramp capacitor 34 and switch 36.

Frequency-to-current converter 32 includes a one shot unit 52, an averaging unit 54 and a voltage-to-current unit 56. One shot unit 52 includes a flip-flop 60 having a SET terminal 61, a RESET terminal 62 and an OUTPUT terminal 63. One shot unit 52 also includes a comparator 64 having a noninverting input terminal 65, an inverting input terminal 66 and an output terminal 67. A signal $V_{REF}$ is received at noninverting input terminal 65. Output terminal 67 is coupled with RESET terminal 62. SET terminal 61 receives an input signal CLK having a frequency $f_1$. A capacitor $C_1$ is coupled between inverting input terminal 66 and a ground terminal 33. A charging current $I_{CH}$ is received at inverting input terminal 66 and charges capacitor $C_1$. A switch 68 is coupled across capacitor $C_1$ in an orientation appropriate to short capacitor $C_1$ when switch 68 is closed. Switch 68 is driven by an actuating signal $t_{ON}$ presented at OUTPUT terminal 63 (represented by an arrow 69).

Actuating signal $t_{ON}$ is presented to averaging unit 54 to drive a switch 79 (represented by an arrow 70). Averaging unit 54 also includes an amplifier 72 having a noninverting input terminal 73, an inverting input terminal 71 and an output terminal 75. A resistor 74 and a capacitor 76 are coupled in parallel between output terminal 75 and inverting input terminal 71. Noninverting input terminal 73 is coupled with noninverting input terminal 65 of comparator 64 and is coupled with voltage-to-current unit 56. Switch 79 is coupled between inverting input terminal 71 and ground terminal 33 via a current generator 78. Current generator 78 provides a current $I_{CH}$, substantially similar to current $I_{CH}$ provided at inverting input terminal 66. An output signal $V_O$ is provided by averaging unit 54 at an output terminal 80. Output signal $V_O$ is a voltage output signal related to frequency $f_1$, actuating signal $t_{ON}$ and second input reference signal $V_{REF}$.

Voltage-to-current unit 56 includes an amplifier 82 having a noninverting input terminal 81, an inverting input terminal 83 and an output terminal 85. Voltage-to-current unit 56 also includes an NMOS transistor 90 having a drain 92, a gate 94 and a source 96. Voltage-to-current unit 56 further includes a resistor 84. Output signal $V_O$ is received at noninverting input terminal 81. Output terminal 85 is coupled with gate 94. Source 96 is coupled with inverting input terminal 83 and with resistor 84. Source 96 is also coupled, via resistor 84, with noninverting input terminal 65 of comparator 64 and with noninverting input terminal 73 of amplifier 72. Drain 92 is coupled with a current mirror 35. Current mirror 35 presents an output current $I_O$ at output terminal 98. Output terminal 98 is coupled with ramp capacitor 34, switch 36 and load 40.

Actuating signal $t_{ON}$ is generated by one shot unit 52 for actuating switch 79 substantially as defined by the relationship, $$t_{ON} = \frac{C_1 \cdot V_{REF}}{I_{CH}} \quad [3]$$

Averaging unit 54 provides output signal $V_O$ at output terminal 80 substantially as defined by the relationship, $$V_O = I_{CH} R_f d \quad [4]$$

Where, $R_f$ is the value of resistor 74; and $$d = t_{ON} f_1 \quad [5]$$

Voltage-to-current unit 56 presents output current $I_O$ at output terminal 98 substantially as defined by the relationship, $$I_O = \frac{V_O}{R_2} \quad [6]$$

Output current $I_O$ is employed for charging ramp capacitor 34. Peak-to-peak voltage $\Delta V_{RAMP}$ developed across ramp capacitor 34 is substantially as defined by the relationship, $$\Delta V_{RAMP} = \frac{I_O \cdot \Delta t}{C} = \frac{I_O}{C \cdot f_2} \quad [7]$$

Where, C is the value of ramp capacitor 34.

Combining expressions [3], [4], [5], [6] and [7], one may observe that PWM ramp voltage (i.e., voltage across load 40) can be expressed as ratios of resistances, capacitances and frequencies:

$$\Delta V_{RAMP} = \frac{R_f}{R_2} \cdot \frac{C_1}{C} \cdot \frac{f_1}{f_2} \cdot V_{REF} \quad [8]$$

Expression [8] may be expressed in the format of expression [2], $$V_{RAMP} \sim k \cdot \frac{f_1}{f_2} \cdot V_{REF} \quad [2]$$

$$\text{Where, } k = \frac{R_f}{R_2} \cdot \frac{C_1}{C}$$

Such a ratio relationship is amenable to good repeatable design-ratio parameters for producing a PWM ramp signal reliably dependent upon an input voltage $V_{REF}$.

Figure 3:
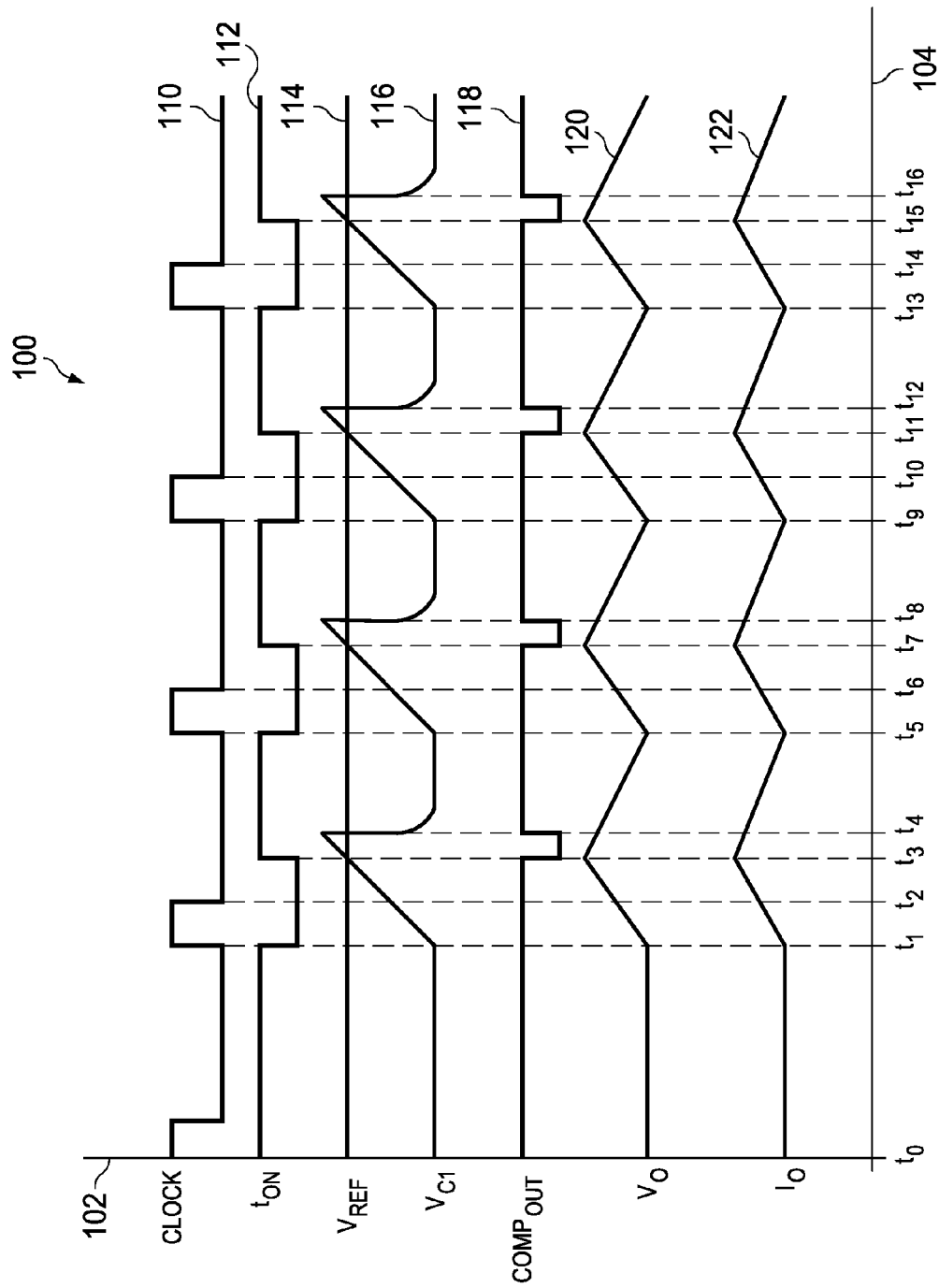
FIG. 3 is a timing diagram that generally depicts the operation of the circuits of FIGS. 2 and 3.

FIG. 3 is a timing diagram that generally depicts the operation of the circuits of FIGS. 2 and 3. A curve 110 represents input reference voltage CLK (having a frequency $f_1$) that appears at SET terminal 61 (FIG. 2). A curve 112 represents actuating signal $t_{ON}$ that appears at OUTPUT terminal 63 (FIG. 2) for actuating switch 79. A curve 114 represents voltage signal $V_{REF}$ that appears at noninverting input terminal 65 (FIG. 2). A curve 116 represents voltage $V_{C1}$ across capacitor $C_1$ (FIG. 2). A curve 118 represents an output signal $COMP_{OUT}$ appearing at output terminal 67 (FIG. 2). A curve 120 represents output signal $V_O$ appearing at output terminal 80 (FIG. 2). A curve 122 represents output current $I_O$ that appears at output terminal 98 and is employed for charging ramp capacitor 34 (FIG. 2).

At time $t_1$, input reference signal CLK goes positive and sets flip-flop 60 so that actuating signal $t_{ON}$ pulses negatively. Switch 68 is open and charging current $I_{CH}$ begins to charge capacitor $C_1$ so voltage $V_{C1}$ begins to rise. Voltage $V_{C1}$ is less than voltage $V_{REF}$, so comparator output signal $COMP_{OUT}$ is high. Also at time $t_1$, because actuator signal $t_{ON}$ closes switch 79, output signal $V_O$ begins to rise. The rising of output signal $V_O$ causes current output signal $I_O$ to rise.

At time $t_2$, input reference signal CLK returns to its lower level. At time $t_3$, voltage $V_{C1}$ becomes greater than voltage $V_{REF}$, so comparator output signal $COMP_{OUT}$ goes low. Output signal $COMP_{OUT}$ going low resets flip-flop 60, so actuator signal $t_{ON}$ goes high and closes switch 68. Switch 68 shorts capacitor $C_1$. Capacitor $C_1$ does not react immediately, and voltage $V_{C1}$ goes low at time $t_4$. When voltage $V_{C1}$ is less than voltage $V_{REF}$, comparator output signal $COMP_{OUT}$ goes high. Actuator signal $t_{ON}$ going high at time $t_3$ causes switch 79 to open, thereby causing output signal $V_O$ and current output signal $V_O$ to go low. Output signals $V_O$, $V_O$ reach a low level at time $t_5$, when input reference signal CLK goes high again, resetting flop-flop 60.

Signal excursions and events described above in connection with time interval $t_1$-$t_5$ are repeated substantially identically during subsequent time intervals $t_5$-$t_9$, $t_9$-$t_{13}$ and in later intervals (not shown in FIG. 3). In the interest of avoiding prolixity, those signal excursions and events will not be repeated in detail here.

As mentioned earlier herein, FIGS. 2 and 3 describe construction and operation of a representative embodiment of the present invention. Other embodiments may be employed for carrying out the invention. By way of example and not by way of limitation, one may eliminate the use of one shot unit 56 (FIG. 2) if duty cycle of input reference signal CLK is substantially constant over the spectrum of frequencies at which input reference signal CLK may be set by users. By way of further example and not by way of limitation, the embodiment illustrated in FIG. 2 is configured for detecting a rising edge of input reference signal CLK. Other embodiments that detect other features of input reference signal CLK, such as detecting a falling edge, are within the knowledge of one skilled in the relevant art and are within the intended scope of the present invention.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

We claim:

1. A frequency-to-current converter comprising: a one-shot unit including:
    a comparator having a first input terminal, a second input terminal, and an output terminal, wherein the first input terminal receives a reference voltage and the second input terminal receives a charging current;
    a first capacitor that is coupled to the second input terminal of the comparator;
    a flip-flop having a first input terminal and a second input terminal, wherein the first input terminal of the flip-flop is coupled to the output terminal of the comparator and the second input terminal of the flip-flop receives a clock signal; and
    a first switch that is coupled to the second input terminal of the comparator, wherein the first switch is actuated and deactuated by a signal output from the flip-flop;
an averaging unit wherein, the averaging unit further comprises:
    a second switch that is actuated and deactuated by the signal output from the flip-flop;
    an amplifier having a first input terminal, a second input terminal, and an output terminal, wherein the first input terminal of the amplifier is coupled to the second switch;
    a resistor that is coupled between the output terminal of the amplifier and the first input terminal of the amplifier; and
    a second capacitor that is coupled between the output terminal of the amplifier and the first input terminal of the amplifier; and
a voltage-to-current unit that is coupled to the averaging unit.

2. The frequency-to-current converter of claim 1, wherein the frequency-to-current converter further comprises a current mirror that is coupled to the voltage-to-current unit.

3. The frequency-to-current converter of claim 1, wherein the voltage-to-current unit further comprises:
    a second amplifier having a first input terminal, a second input terminal, and an output terminal, wherein the first input terminal of the second amplifier is coupled to the averaging unit;
    an NMOS transistor that is coupled to the output terminal of the second amplifier at its gate; and
    a resistor that is coupled to the source of the NMOS transistor.

4. An apparatus comprising:
a one-shot unit wherein, the one-shot unit further comprises:
    a comparator having a first input terminal, a second input terminal, and an output terminal, wherein the first input terminal receives a reference voltage and the second input terminal receives a charging current;
    a first capacitor that is coupled to the second input terminal of the comparator;
    a flip-flop having a first input terminal and a second input terminal, wherein the first input terminal of the flip-flop is coupled to the output terminal of the comparator and the second input terminal of the flip-flop receives a clock signal; and
    a first switch that is coupled to the second input terminal of the comparator, wherein the first switch is actuated and deactuated by a signal output from the flip-flop;
an averaging unit wherein, the averaging unit further comprises:
    a second switch that is actuated and deactuated by the signal output from the flip-flop;
    an amplifier having a first input terminal, a second input terminal, and an output terminal, wherein the first input terminal of the amplifier is coupled to the second switch;
    a resistor that is coupled between the output terminal of the amplifier and the first input terminal of the amplifier; and
    a second capacitor that is coupled between the output terminal of the amplifier and the first input terminal of the amplifier;
a voltage-to-current unit that is coupled to the averaging unit;
a current mirror that is coupled to the voltage-to-current unit;
a third capacitor that is coupled to the current mirror; and
a third switch that is coupled generally in parallel to the third capacitor.

5. The apparatus of claim 4, wherein the voltage-to-current unit further comprises:
    a second amplifier having a first input terminal, a second input terminal, and an output terminal, wherein the first input terminal of the second amplifier is coupled to the averaging unit;
    an NMOS transistor that is coupled to the output terminal of the second amplifier at its gate and that is coupled to the current mirror at its drain; and
    a resistor that is coupled to the source of the NMOS transistor.

* * * * *

UNITED STATES PATENT AND TRADEMARK OFFICE
CERTIFICATE OF CORRECTION

PATENT NO. : 7,627,053 B2  
APPLICATION NO. : 11/170203  
DATED : December 1, 2009  
INVENTOR(S) : Wiktor et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 881 days.

Signed and Sealed this

Second Day of November, 2010

David J. Kappos
*Director of the United States Patent and Trademark Office*